(12) United States Patent
Zhang (10) Patent No.: US 10,446,605 B2
(45) Date of Patent: Oct. 15, 2019

(54) SEMICONDUCTOR DEVICE AND METHOD FOR FABRICATING THE SAME

(71) Applicant: Enkris Semiconductor, Inc., Suzhou (CN)

(72) Inventor: Liyang Zhang, Suzhou (CN)

(73) Assignee: Enkris Semiconductor, Inc., Jiangsu (CN)

( * ) Notice: Subject to any disclaimer, the term of this patent is extended or adjusted under 35 U.S.C. 154(b) by 0 days.

(21) Appl. No.: 15/763,610

(22) PCT Filed: Jan. 12, 2017

(86) PCT No.: PCT/CN2017/070990
§ 371 (c)(1),
(2) Date: Mar. 27, 2018

(87) PCT Pub. No.: WO2018/129697
PCT Pub. Date: Jul. 19, 2018

(65) Prior Publication Data
US 2019/0051697 A1 Feb. 14, 2019

(51) Int. Cl.
*H01L 29/20* (2006.01)
*H01L 27/15* (2006.01)
(Continued)

(52) U.S. Cl.
CPC ........ *H01L 27/156* (2013.01); *H01L 33/0079* (2013.01); *H01L 33/382* (2013.01);
(Continued)

(58) Field of Classification Search
CPC ..... H01L 27/156; H01L 33/505; H01L 33/62; H01L 33/46; H01L 2933/16; H01L 33/44;
(Continued)

(56) References Cited

U.S. PATENT DOCUMENTS

2012/0007120 A1 1/2012 Kim et al.
2012/0248408 A1 10/2012 Paek et al.
(Continued)

FOREIGN PATENT DOCUMENTS

CN 102738342 A 10/2012
CN 103383949 A 11/2013
(Continued)

OTHER PUBLICATIONS

Written Opinion of the International Searching Authority from corresponding Patent Cooperation Treaty (PCT) Application No. PCT/CN2017/070990, indicated completed on Oct. 9, 2017.
(Continued)

*Primary Examiner* — Didarul A Mazumder
*Assistant Examiner* — Wasiul Haider
(74) *Attorney, Agent, or Firm* — Gardner, Linn, Burkhart & Ondersma LLP (57) ABSTRACT

A semiconductor device and a method for fabricating the same are provided. The semiconductor device includes: a substrate, a bonding metal layer, a reflective layer, a first conductive layer, an active layer, a second conductive layer, first electrode(s) and second electrode(s). The first electrode(s) extends, from one side of the bonding metal layer away from the substrate, to the first conductive layer, to be connected with the bonding metal layer and the first conductive layer. The second electrode(s) penetrates through the substrate and the bonding metal layer to be in contact with the reflective layer. The semiconductor device, forming a structure sharing the first conductive layer, has more uniform illumination and a higher light extraction rate, and eliminates interferences between pixel units, achieves better uniformity of emitted light wavelength and makes distribution of electric current flowing through different pixel units more even.

3 Claims, 11 Drawing Sheets

(51) Int. Cl.
*H01L 33/46* (2010.01)
*H01L 33/38* (2010.01)
*H01L 33/44* (2010.01)
*H01L 33/00* (2010.01)
*H01L 33/62* (2010.01)
*H01L 33/50* (2010.01)
*H01L 33/32* (2010.01)
*H01L 33/06* (2010.01)

(52) U.S. Cl.
CPC .............. *H01L 33/44* (2013.01); *H01L 33/46* (2013.01); *H01L 33/007* (2013.01); *H01L 33/06* (2013.01); *H01L 33/32* (2013.01); *H01L 33/505* (2013.01); *H01L 33/62* (2013.01); *H01L 2933/0016* (2013.01); *H01L 2933/0025* (2013.01); *H01L 2933/0041* (2013.01); *H01L 2933/0066* (2013.01)

(58) Field of Classification Search
CPC ... H01L 33/382; H01L 33/0079; H01L 33/06; H01L 2933/0066
See application file for complete search history.

(56) References Cited

U.S. PATENT DOCUMENTS

| | | | |
|---|---|---|---|
| 2013/0292718 A1 | 11/2013 | Chu et al. | |
| 2014/0014990 A1* | 1/2014 | Kim | H01L 33/58 257/98 |
| 2015/0287758 A1* | 10/2015 | Ando | H01L 27/14636 257/774 |
| 2018/0358339 A1* | 12/2018 | Iguchi | G09F 9/33 |

FOREIGN PATENT DOCUMENTS

| | | | |
|---|---|---|---|
| CN | 103390713 A | | 11/2013 |
| CN | 103794689 | * | 2/2014 |
| CN | 103794689 A | | 5/2014 |

OTHER PUBLICATIONS

International Search Report of the International Searching Authority from corresponding Patent Cooperation Treaty (PCT) Application No. PCT/CN2017/070990, indicated completed on Sep. 20, 2017.

* cited by examiner

SEMICONDUCTOR DEVICE AND METHOD FOR FABRICATING THE SAME

CROSS REFERENCE TO RELATED APPLICATIONS

The present patent application claims the priority benefits of International Patent Application No. PCT/CN2017/070990, filed Jan. 12, 2017.

BACKGROUND AND FIELD OF THE INVENTION

The present disclosure concerns the field of semiconductor devices, in particular, concerns a semiconductor device and a method for fabricating the same.

Micro LED display technology is implemented by an all solid-state light-emitting device integrated with a high-density two-dimensional light-emitting diode array on a chip. Compared with other micro display technologies, a micro LED display system has a simple design, may reduce volume and weight of an overall system, and has low manufacturing cost as well as advantages of low power consumption, high light utilization efficiency, rapid responding speed, wide operating temperature range, and strong anti-interference ability and so on. However, the present inventor noticed that in the prior art, the micro LED display chip has a relatively poor emitted light wavelength consistency and low light extraction rate.

SUMMARY OF THE INVENTION

In view of this, an object of the present disclosure is to provide a semiconductor device and a method for fabricating the same, which device has more uniform light emitting and a higher light extraction rate, eliminates interference between pixel units, and has better uniformity of the emitted light wavelength and more uniform electric current flowing through different pixel units.

To achieve the object mentioned above, in one aspect, the present disclosure provides a semiconductor, comprising a substrate, a bonding metal layer, a reflective layer, a first conductive layer, an active layer, a second conductive layer, at least one first electrode and at least one second electrode, wherein the bonding metal layer is provided at one side of the substrate, and the reflective layer is provided at one side, which is away from the substrate, of the bonding metal layer, and the bonding metal layer and the reflective layer are insulated from each other. The second conductive layer is provided at one side, which is away from the bonding metal layer, of the reflective layer, the active layer is provided at one side, which is away from the reflective layer, of the second conductive layer, and the first conductive layer is provided at one side, which is away from the second conductive layer, of the active layer. Each first electrode is configured to successively penetrate through the reflective layer, the second conductive layer and the active layer, from the side, which is away from the substrate, of the bonding metal layer, and to extend to the first conductive layer, and is connected with the bonding metal layer and the first conductive layer, and the first electrode is insulated from the reflective layer, second conductive layer and the active layer, and each second electrode is configured to penetrate through the substrate and the bonding metal layer and is in contact with the reflective layer, and the second electrode is insulated from the bonding metal layer.

Further, the semiconductor also comprises at least one first filling slot configured to run from the bonding metal layer to the first conductive layer, wherein each first filling slot is configured to partially run through the first conductive layer, and the first electrode is located inside the filling slot and connected with the first conductive layer and the bonding metal layer, and at least one second filling slot configured to run from one side, which is away from the bonding metal layer, of the substrate to the reflective layer, wherein the second electrode is located at the second filling slot and connected with the bonding metal layer, wherein an insulation material is provided between the first electrode and a sidewall of the first filling slot to achieve that the first electrode is insulated from the reflective layer, the second conductive layer and the active layer. An insulation material is provided between a sidewall of the second electrode and the second filling slot, to achieve that the second electrode is insulated from the bonding metal layer and the substrate. And an insulation material is provided between the bonding metal layer and the reflective layer, to achieve insulation between the bonding metal layer and the reflective layer.

Further, one side, which is away from the active layer, of the first conductive layer is provided with at least one groove configured to run through at least the first conductive layer, the active layer, the second conductive layer, and the reflective layer, the groove dividing the semiconductor device into different pixel units.

Preferably, an insulation material is provided on a bottom and sidewalls of the groove.

Further, the semiconductor device also comprises a fluorescence powder layer provided on the first conductive layer, wherein the fluorescence powder layer is made from quantum dot fluorescence powder.

Further, the semiconductor device also comprises a groove configured to run through at least the first conductive layer, the active layer, the second conductive layer, and the reflective layer from one side, which is away from the active layer, of the first conductive layer, the groove dividing the semiconductor device into different pixel units.

Further, the semiconductor device also comprises at least one connection pad located at the side, which is away from the bonding metal layer, of the substrate, with each connection pad connected with one of the at least one first electrode.

The present disclosure, in another aspect, provides a method for fabricating a semiconductor device, the method including: successively growing a first conductive layer, an active layer, a second conductive layer and a reflective layer on a base; forming at least one first filling slot at one side, which is away from the second conductive layer, of the reflective layer, wherein the first filling slot completely runs through the second conductive layer and the active layer and partially runs through the first conductive layer; growing one layer of an insulation material at the side, which is away from the second conductive layer, of the reflective layer; fabricating a first electrode in each first filling slot, wherein the first electrode is insulated from the reflective layer, the second conductive layer and the active layer, and the first electrode is made to be connected with the first conductive layer; forming a bonding metal layer and a substrate at the side, which is away from the second conductive layer, of the reflective layer, wherein the first electrode successively penetrates through the reflective layer, the second conductive layer and the active layer, from the side, which is away from the substrate, of the bonding metal layer, and extends to the first conductive layer, so as to be connected with the bonding metal layer and first conductive layer; forming at least one second filling slot which successively runs through the substrate and the bonding metal layer from one side, which is away from the reflective layer, of the substrate; and fabricating a second electrode in each second filling slot in such a way that the second electrode is in contact with the reflective layer and insulated from the bonding metal layer and the substrate.

Further, the step of fabricating a first electrode in each first filling slot includes: filling an insulation material in the first filling slot; etching the insulation material in the first filling slot to form an accommodation space for accommodating an electrode material; and filling the electrode material in the accommodation space to form the first electrode, with the first electrode insulated from the reflective layer, the second conductive layer and the active layer through the remaining insulation material in the first filling slot.

Further, the step of filling an electrode material in the second filling slot to form the second electrode includes: filling an insulation material in the second filling slot; etching the insulation material in said second filling slot to form an accommodation space for accommodating an electrode material; and filling the electrode material in the accommodation space to form the second electrode, with the second electrode insulated from the bonding metal layer and the substrate through the remaining insulation material in the second filling slot.

Further, the method also includes: removing the substrate, and forming at least one groove at least running through the first conductive layer, the active layer, the second conductive layer and the reflective layer from one side of the first conductive layer away from the active layer, wherein the groove divides the semiconductor device into different pixel units.

Further, the method also includes: growing the insulation material at the side of the first conductive layer away from the active layer, to form an insulation layer grown at the first conductive layer and a bottom and sidewalls of the groove; and etching the insulation material grown on the first conductive layer, and forming a fluorescence powder layer on the first conductive layer.

The semiconductor device provided by the present disclosure is fabricated by using thin-film flip chip technology, wherein the substrate is easy to be stripped off. The semiconductor device has features of uniform light emitting and a higher light extraction rate. The individual first electrode and second electrode are configured in each pixel unit, and end faces of the first electrode and the second electrode are located at the same side of the device, facilitating the sequential use of the semiconductor device. Providing the individual first electrode and second electrode in each pixel unit enables the difference of the equivalent resistances between pixel units to be reduced, eliminates interferences between pixel units, and achieves better uniformity of emitted light wavelength, and more uniform distribution of electric current flowing through different pixel units.

BRIEF DESCRIPTION OF THE DRAWINGS

For clearer description of technical solutions of embodiments of the present disclosure or in the prior art, Figures required to be used in embodiments are briefly introduced below, and those skilled in the art may derive further figures without making any inventive efforts according to the accompanying figures. The above mentioned and other objects, features and advantages of the present disclosure will become clearer via the accompanying figures. Like reference numerals in all figures refer to like parts. The figures which do not necessarily present the real scale are aimed at illustrating the spirit of the disclosure.

Reference numerals: 100—base; 101—first conductive layer; 102—active layer; 103—second conductive layer; 104—reflective layer; 105—bonding metal layer; 106—substrate; 107—first electrode; 108—second electrode; 109—groove; 110—insulation material; 111—connection pad; 112—insulation layer; 113—fluorescence powder layer; 114—cathode; 115—anode; 1071—first filling slot; 1081—second filling slot; 1131—mask; 1132—quantum dot fluorescence powder.

DETAILED DESCRIPTION OF THE EMBODIMENTS

The technical solutions of embodiments of the present disclosure are described clearly and completely below in conjunction with accompanying figures in embodiments of the present disclosure. Apparently, the described embodiments are only some, not all of, embodiments of the present disclosure. All further embodiments derived from the embodiments in the present disclosure by those skilled in the art without making any inventive efforts shall fall within the protection scope of the present disclosure.

It should be noted that similar reference numerals and letters in the following figures refer to similar items, therefore once one item is defined in one figure, it doesn't need to be further defined or explained in the following figures. Meanwhile in the description of present disclosure, terms "first", "second" and so on are only used for descriptive purpose, but should not be understood as indicating or hinting to have importance in relativity. In description of embodiments of present disclosure, it should be understood that when a layer (or film), a region, a pattern or a structure is recited to be "above" or "below" another substrate, another layer (or film), another region, another pad or another pattern, it may be "directly" or "indirectly" above another substrate, layer (or film), region, pad or pattern, or there may be one or more intermediate layers. Such position of the layer has been described with reference to figures. On purpose of convenience or clarity, thickness and size of each layer shown in accompanying figures may be enlarged, omitted or schematically drawn. Additionally, the size of a component does not fully reflect the actual size.

Figure 1:
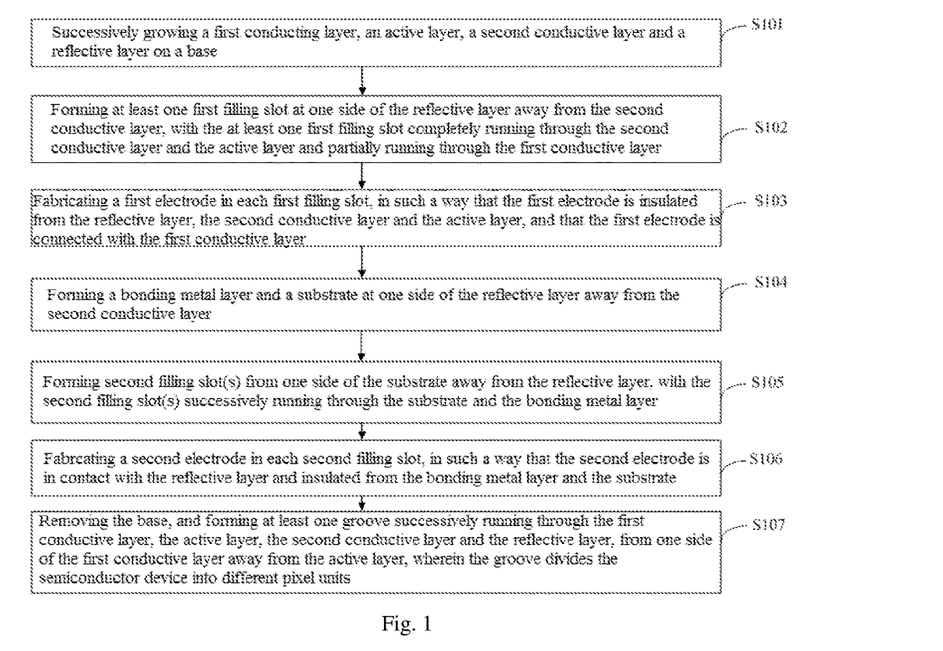
FIG. 1 is a process schematic view showing a method for fabricating a semiconductor device provided by an embodiment of the present disclosure.
Figure 2:
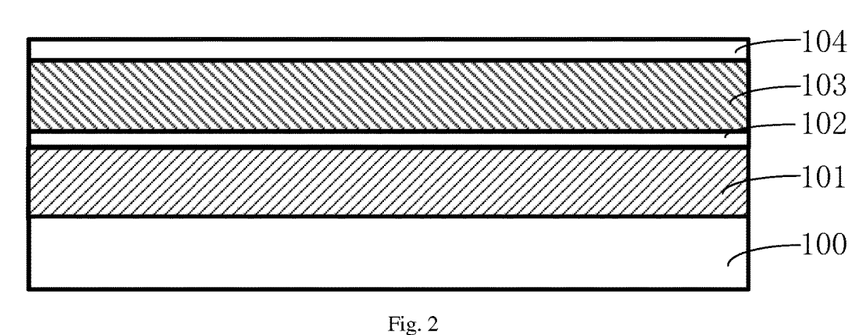
FIG. 2 to FIG. 18 are structural schematic views showing semiconductor devices corresponding to individual process steps of a method for fabricating a semiconductor device provided by an embodiment.

FIG. 1 to FIG. 18 show technological processes of methods for fabricating said semiconductor device of a preferred embodiment of present disclosure. The processes are described in detail with reference to the accompanying figures as follows. It should be indicated that the methods mentioned in the present disclosure are not limited by FIG. 1 as well as the following mentioned specified order. It should be understood that in other embodiments, the sequence of part of steps in mentioned method of present disclosure may change according to practical requirements, or part of steps in the same also may be omitted or deleted. As shown in FIG. 1, the fabricating method includes the following steps:

Step S101, as shown in FIG. 2, a first conducting layer 101, an active layer 102, a second conductive layer 103 and a reflective layer 104 are successively grown on a base 100

Figure 3:
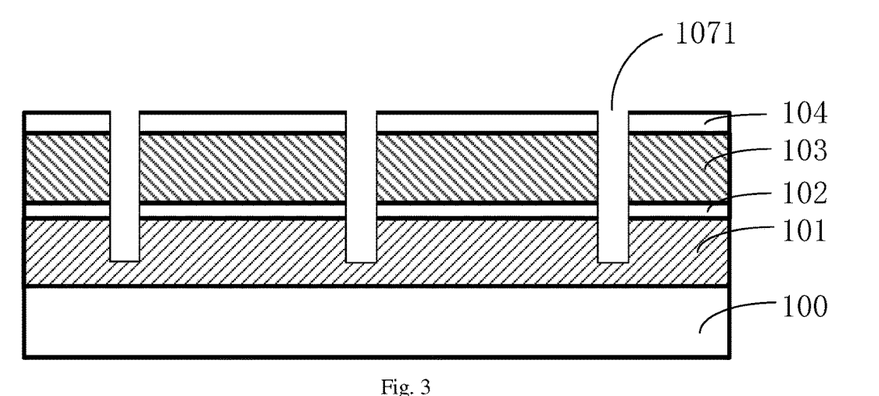

Step S102, as shown in FIG. 3, at least one first filling slot 1071 is formed on one side, which is away from the second conductive layer 103, of said reflective layer 104, wherein said first filling slot 1071 completely runs through the second conductive layer 103 and the active layer 102 and partially runs through first conductive layer 101.

Figure 4:
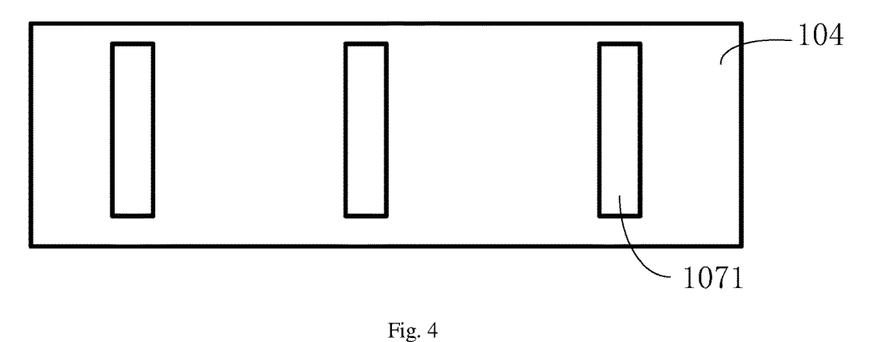

In the present embodiment, an etching method may be used to form said first filling slot 1071, the first filling slot 1071 successively runs through said reflective layer 104, said second conductive layer 103 and said active layer 102 and extends to said first conductive layer 101, but does not run through the first conductive layer 101. In detail, as shown in FIG. 4, FIG. 4 shows a top view viewing from one side of the reflective layer 104 after the forming of the first filling slot 1701. Said first filling slot 1701 may extend a certain distance on a plane Step S103, a first electrode 107 is fabricated in each first filling slot 1071, in such a way that the first electrode 107 is insulated from said reflective layer 104, said second conductive layer 103 and said active layer 102 and said first electrode 107 is connected with said first conductive layer 101.

Figure 5:
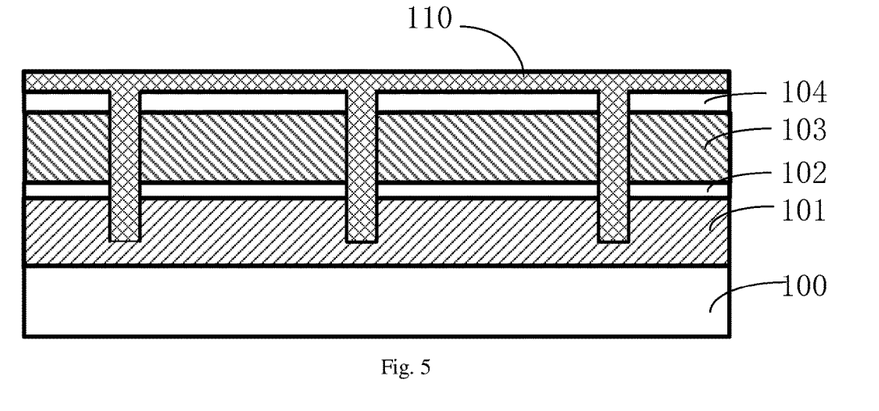
Figure 6:
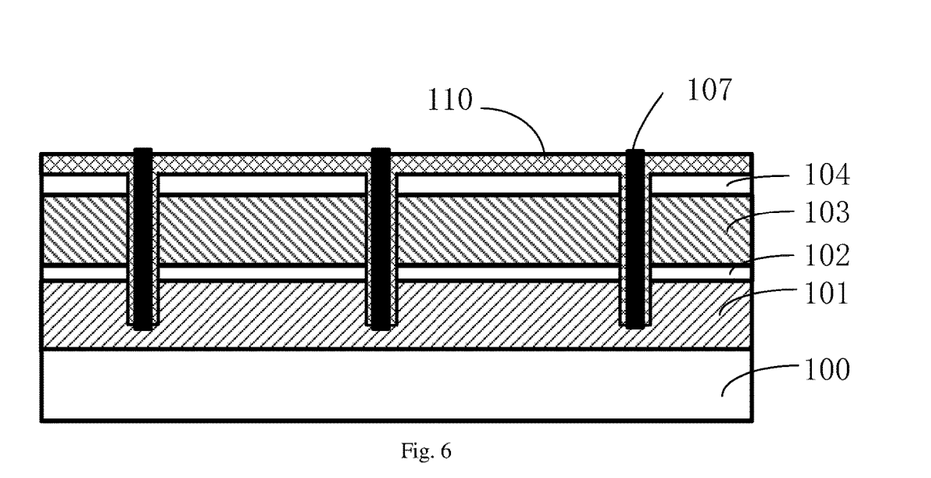

In the present embodiment, Step S103 of forming said first electrode 107 may specifically include the following sub-steps:

Sub-step a, as shown in FIG. 5, growing one layer of an insulation material 110 from one side of said reflective layer 104 away from second conductive layer 103, and filling the insulation material 110 in the first filling slot 1071; and Sub-step b, as shown in FIG. 6, etching the insulation material 110 in said first filling slot 1701 to form an accommodation space for accommodating an electrode material, and then filling said electrode material in the accommodation space to form said first electrode 107.

In the present embodiment, the insulation material 110 is partially remaining between the first electrode 107 and a sidewall of said first filling slot 1071, thus achieving that the first electrode 107 is insulated from said reflective layer 104, said second conductive layer 103 as well as said active layer 102, and making said first electrode 107 connected with said first conductive layer 101.

Figure 7:
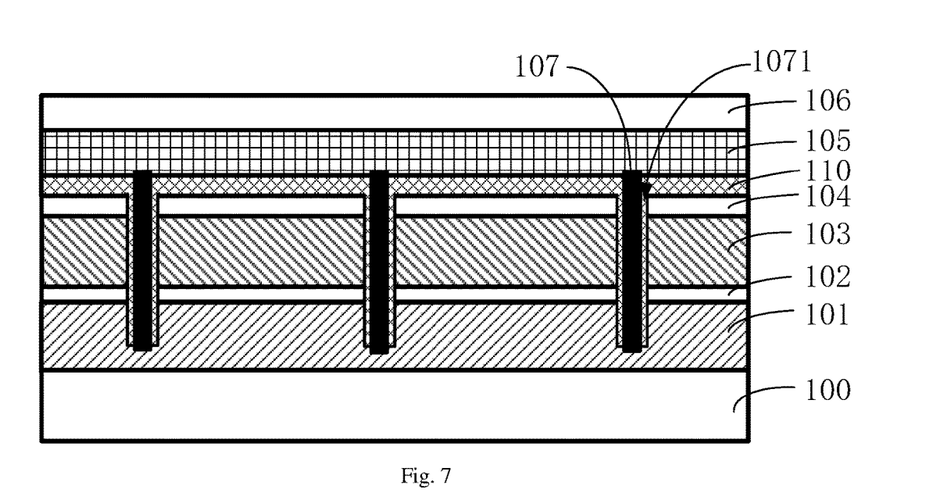

Step S104 as shown in FIG. 7, a bonding metal layer 105 and a substrate 106 are successively grown from one side, which is away from second conductive layer 103, of said reflective layer 104. Said bonding metal layer 105 is connected with said first electrode 107.

Figure 8:
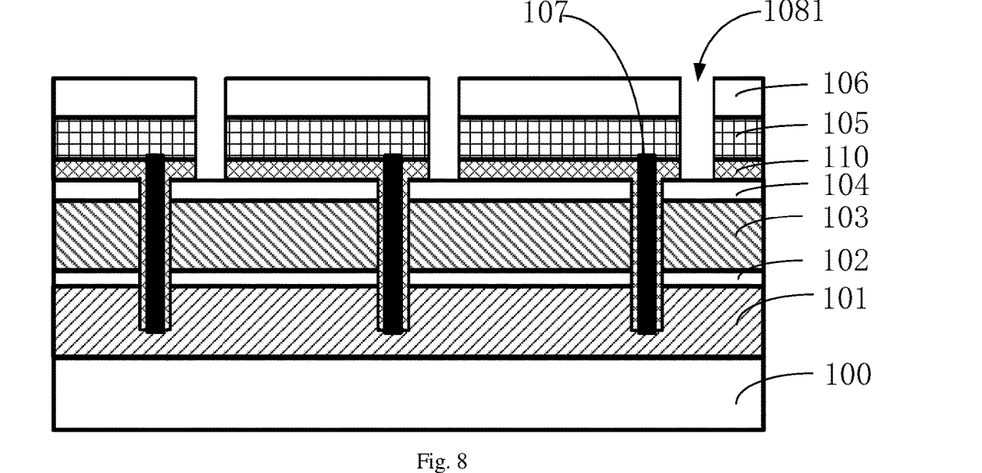

Step S105, as shown in FIG. 8, second filling slot(s) 1081 which successively runs through said substrate 106 and said bonding metal layer 105 is formed from one side, which is away from insulation materials 110, of said substrate 106.

Figure 9:
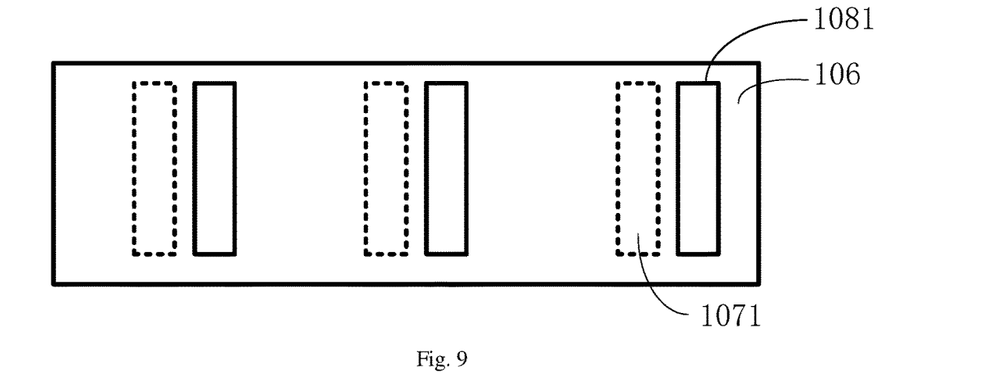

In the present embodiment, an etching method may be used to form said second filling slot(s) 1081. The second filling slot(s) 1081 successively runs through said substrate 106 and said bonding metal layer 105. The second filling slot(s) 1081 also runs through the insulation material 110 between said bonding metal layer 105 and said reflective layer 104, and extends to a surface of the reflective layer 104. In detail, as shown in FIG. 9, FIG. 9 shows a top view viewing from one side of the substrate 106 after forming the second filling slot(s) 1081. Similar to said first filling slot 1071, said second filling slot 1081 may extend a certain distance on a plane.

Step S106, a second electrode 108 is fabricated in said second filling slot 1081 in such a way that the second electrode 108 is connected with said reflective layer 104.

Figure 10:
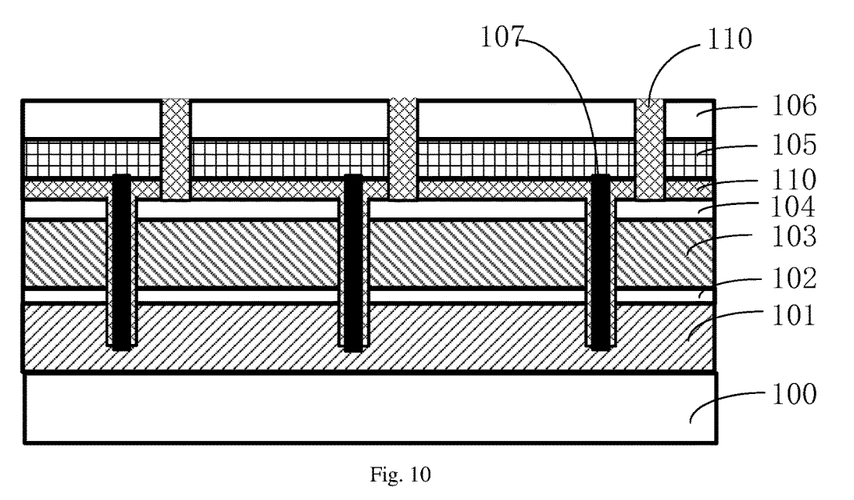
Figure 11:
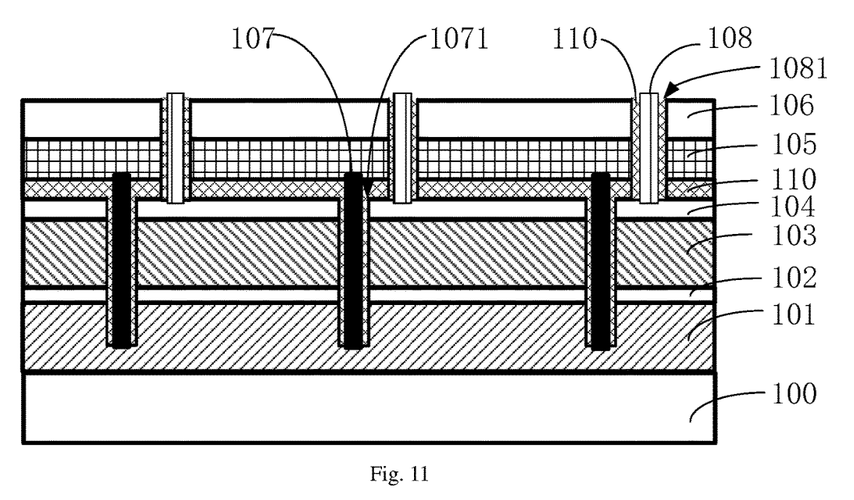

In one embodiment, the step of forming said second electrode 108 may specifically include the following sub-steps:

Sub-step c, as shown in FIG. 10, filling the insulation material 110 in said second filling slot 1081; and Sub-step d, as shown in FIG. 11, etching the insulation material 110 in said second filling slot 1081 to form an accommodation space for accommodating an electrode material, and filling the electrode material in said accommodation space to form said second electrode 108.

In the present embodiment, the insulation material 110 remaining after etching are between the second electrode 108 and a sidewall of said second filling slot 1081, thus achieving an effect of insulation between said second electrode 108 and said bonding metal layer 105, and achieving an effect of connection between the second electrode 108 and the reflective layer 104.

In the present embodiment, said insulation material 110 may be silicon dioxide or silicon nitride and so on, but not limited thereto, or may also be any other appropriate insulation material 110. Specifically, the insulation material 110 for insulation may be directly formed in first filling slot 1071 and second filling slot 1081 respectively by chemical vapor deposition and other manners, so that there is no need to achieve necessary electric blocking (insulation) through processes of filling, etching and so on.

Figure 12:
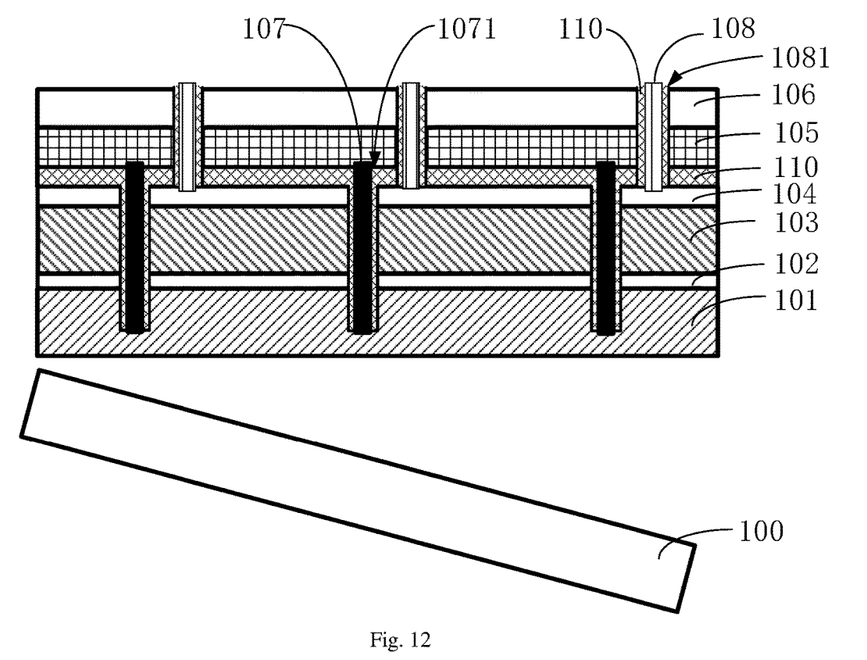
Figure 13:
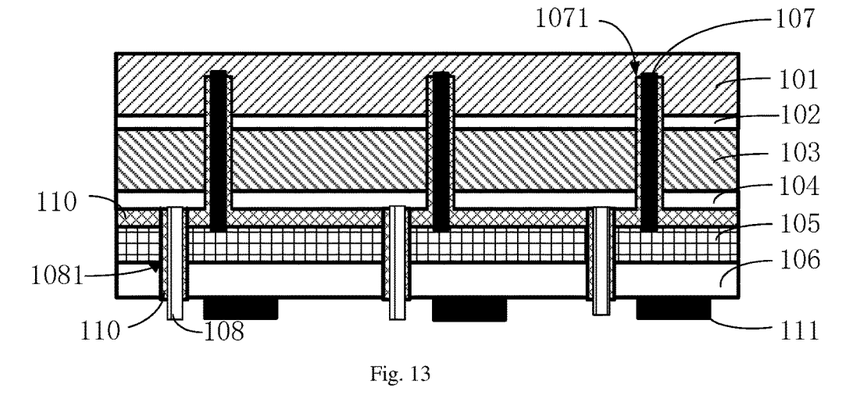
Figure 14:
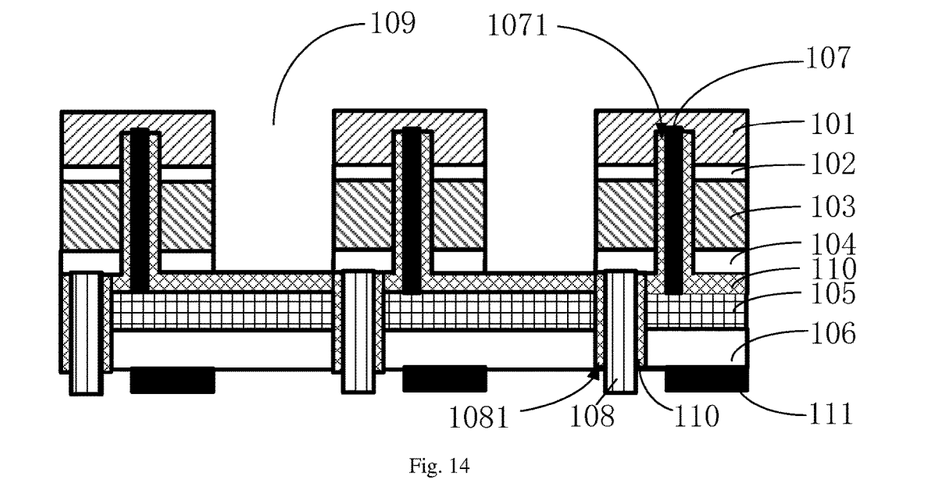

Step S107, as shown in FIG. 12 to FIG. 14, said base 100 is removed, and at least one groove 109 is formed from one side, which is away from the active layer 102, of said first conductive layer 101, with the groove successively running through the first conductive layer 101, the active layer 102, the second conductive layer 103 and the reflective layer 104. Preferably, said groove 109 comprises multiple grooves.

Additionally, before stripping off said base 100, the method may also comprise a step of fabricating connection pads 111 (shown in FIG. 13) connected with said first electrodes 107 respectively at one side of said substrate 106 away from the bonding metal layer 105. The method of producing the connection pad 111 may be implemented by using any current feasible processes, which are not explained here again.

The connection pads 111 are each used for connection with an external driving circuit. The electrode material for fabricating the first electrode 107 and the connection pad 111 may consist of one or more selected from the following materials, for example: carbon, copper, silver, zinc, platinum, tantalum nitride, titanium nitride, tantalum, tungsten-based metals, nickel-based metals and other materials with good conductivity, which are not limited in the embodiments of the present disclosure.

The grooves 109 are used to divide the first conductive layer 101, the active layer 102, the second conductive 103 and the reflective layer 104 into multiple different portions, forming multiple pixel units, wherein the adjacent pixel units are separated by one groove 109, each pixel comprises one first electrode 107, one second electrode 108 and one connection pad 111. In one preferable embodiment, said first conductive layer 101 may have N type conductivity, and the second conductive layer 103 may have P type conductivity. In other embodiments of the present disclosure, the grooves 109 may run through the insulation material 110, without running through the bonding metal layer 105.

As shown in FIG. 13, a schematic view showing a reversed overall structure after removing the base 100, the grooves 109 are fabricated based thereon. Besides, the method may also comprise a step of fabricating connection pads 111 connected with said first electrodes 107 respectively on one side of said substrate 106 away from the bonding metal layer 105, after stripping off said base 100. The method of producing the connection pads 111 may be implemented by using any current feasible processes, which are not explained here again.

It may be understood that as shown in FIG. 14, in a specific structure of a semiconductor device provided by present embodiment, said groove 109 preferably runs through said reflective layer 104, and may run through a part of the bonding metal layer 105 but not run through the overall bonding metal layer 105. In the present embodiment, an etching method may be used to form the groove 109.

It may be understood that the step of stripping off the base 100 may also be performed after the step of forming the grooves 109. Alternatively, the base 100 may be removed just after forming the first electrode(s) 107 and second electrode(s) 108, followed by reversing the overall structure, and etching to obtain grooves 109 of different depths according to different structures of pixel units.

It may be understood that, as shown in FIG. 14, in present embodiment, the depth of said groove 109 is equal to a sum of thicknesses of said first conductive layer 101, said active layer 102, said second conductive layer 103, and said reflective layer 104, but present disclosure is not limited to this. The groove 109 may also be deeper to thereby the bonding metal layer 105 is etched but the bonding metal layer 105 is not etched enough to be through. One end(s) of said first electrode(s) 107 is connected with said first conductive layer 101, and the other end(s) of the first electrode(s) is connected with said bonding metal layer 105, so that the bonding metal layer 105 is in communication with the first conductive layer 101 of each pixel unit via said first electrode(s) 107, forming a structure sharing the first conductive layer 101. One end(s) of said second electrode(s) 108 is connected with said reflective layer 104, the other end(s) of said second electrode is located at one side of said substrate 106 away from said bonding metal layer 105.

Figure 15:
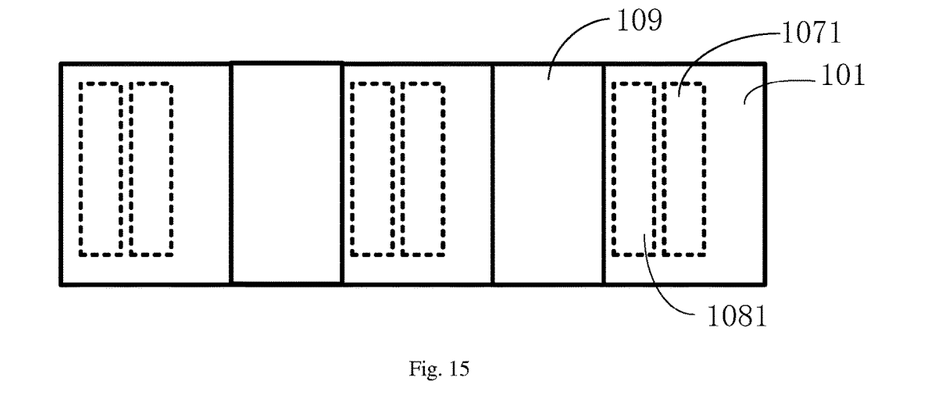

Specifically, as shown in FIG. 15, FIG. 15 shows a top view viewing from one side of the first conductive layer 101 after forming of said grooves 109. Said grooves 109 may extend from one end to the other end of first conductive layer 101 on a plane.

As mentioned above, end surfaces of said first electrodes 107 and said second electrodes 108 are located at the same side of substrate 106, facilitating subsequent use of the semiconductor device.

Further, the method of fabrication may also include the following steps.

Figure 16:
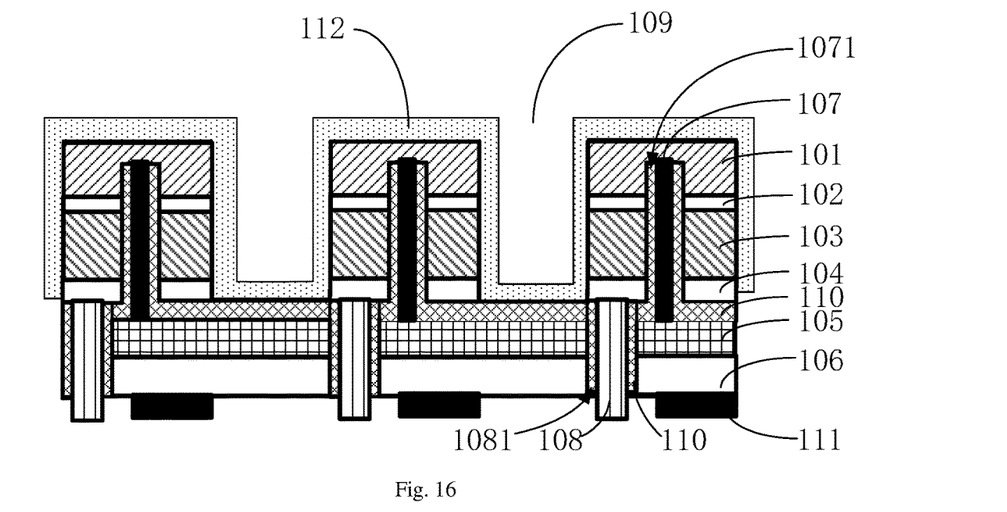

As shown in FIG. 16, the insulation material 110 is grown from one side of said first conductive layer 101 away from said active layer 102, to form an insulation layer 112 grown on the first conductive layer 101 and bottoms and sidewalls of said grooves 109.

Figure 17:
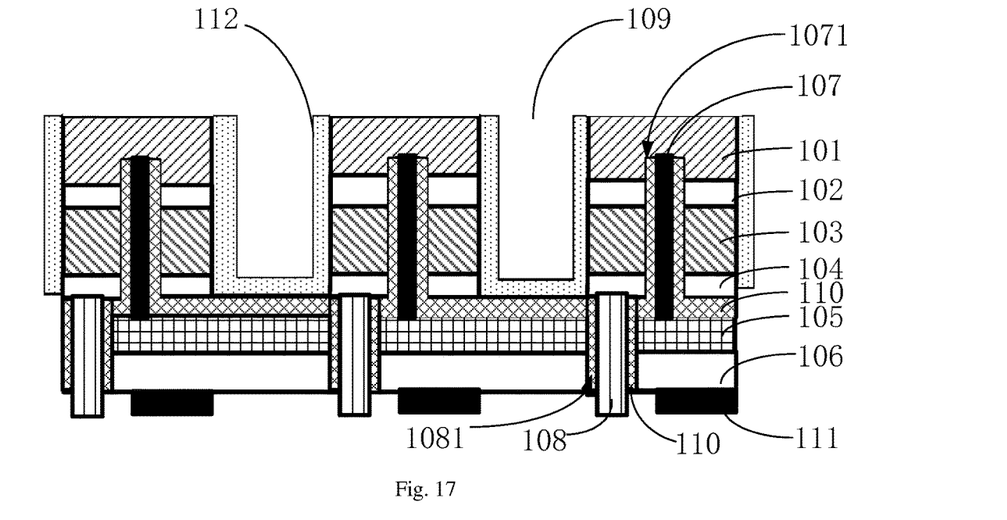
Figure 18:
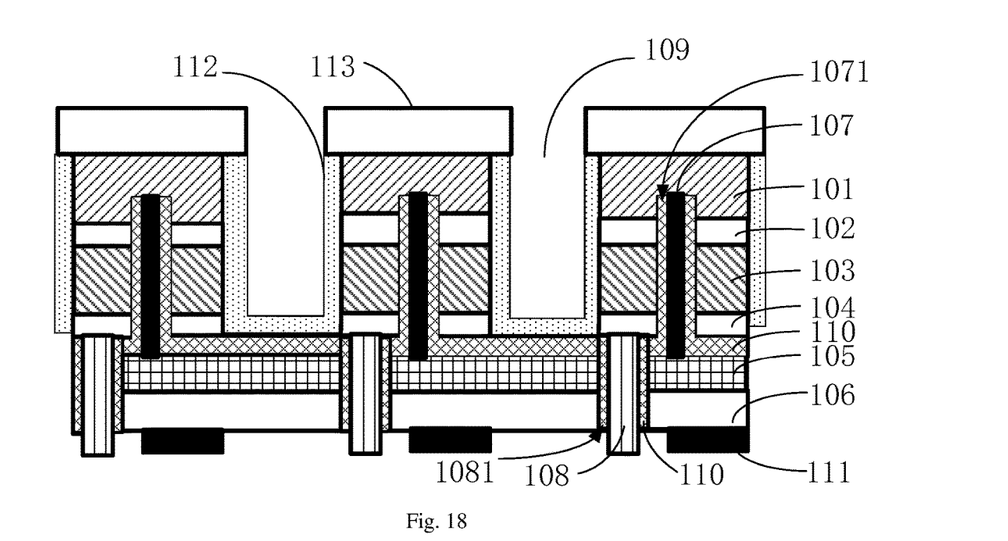

As shown in FIG. 17 and FIG. 18, the insulation layer 112 grown on said first conductive layer 101 is etched, and a fluorescence powder layer 113 is formed on the first conductive layer 101.

It may be understood that in other embodiments of the present disclosure, said insulation layer 112 may not be formed, and the fluorescence powder layer 113 is directly formed on the first conductive layer 101 after forming the grooves 109.

Figure 19:
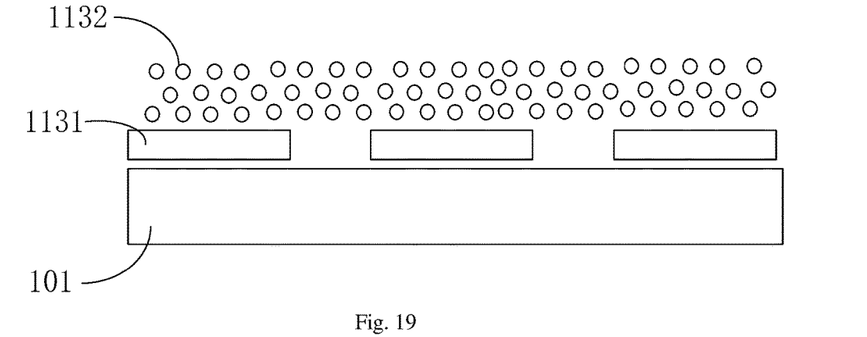
FIG. 19 is a schematic view showing quantum dot fluorescence powder coating in a semiconductor device provided by an embodiment of the present disclosure.

The fluorescence powder layer 113 may use fluorescence powder in a form of quantum dot. As shown in FIG. 19, fluorescence powder may be deposited in a specific region by using a mask 1131 and a solution containing quantum dot fluorescence powder 1132 via a spray deposition manner, to form said fluorescence powder layer 113, thus achieving color display of the semiconductor devices.

Semiconductor devices fabricated by the methods of embodiments of the present disclosure have uniform illumination and a higher light extraction rate. Moreover, by providing two independent electrodes for each pixel unit, equivalent resistance between pixel units is reduced, interference between pixel units is eliminated, and uniformity of emitted light wavelength is better, thus distribution of electric current flowing through different pixel units is more uniform.

Figure 20:
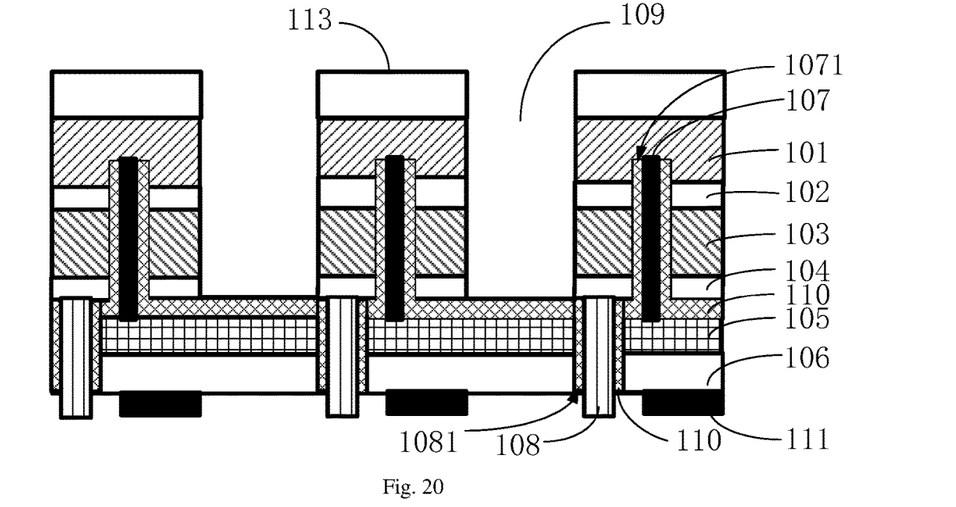
FIG. 20 is a section schematic view showing a semiconductor device provided by an embodiment of the present disclosure.

As shown in FIG. 20, an embodiment of the present disclosure provides a structural schematic view of a semiconductor device. The semiconductor device includes: a first conductive layer 101, an active layer 102, a second conductive 103, a reflective layer 104, a bonding metal layer 105 and a substrate 106. The bonding metal layer 105 is provided at one side of said substrate 106. Said reflective layer 104 is provided at one side of said bonding metal layer 105 away from said substrate 106. The second conductive layer 103 is provided at one side of said reflective layer 104 away from said bonding metal layer 105. The active layer 102 is provided at one side of said second conductive layer 103 away from said reflective layer 104. The first conductive layer 101 is provided at one side of said active layer 102 away from the second conductive layer 103.

The semiconductor device further includes at least one first electrode 107, at least one second electrode 108 and an insulation material 110 located between the bonding metal layer 105 and the reflective layer 104.

The first electrode 107 successively penetrates through said reflective layer 104, said second conductive layer 103 and said active layer 102, from one side of said bonding metal layer 105 away from said substrate 106, and extends to said first conductive layer 101, so as to be connected with said bonding metal layer 105 and said first conductive layer 101. The first electrode 107 is insulated from said reflective layer 104, said second conductive layer 103 and said active layer 102. In present embodiment, the semiconductor device is provided with at least one first filling slot 1071 running from said reflective layer 104 to said first conductive layer 101. The first electrode 107 is formed by using the electrode material filled in the first filling slot 1071. Configuration of the insulation material 110 between the first electrode 107 and a sidewall of said first filling slot 1071 achieves necessary insulation of the first electrode 107 from the reflective layer 104, second conductive layer 103 and the active layer 102.

The second electrode 108 penetrates through said substrate 106 and the bonding metal layer 105 to be in contact with said reflective layer 104, and the second electrode 108 and the bonding metal layer 105 are insulated from each other. In the present embodiment, the semiconductor device is provided with at least one second filling slot 1081 running from one side of the substrate 106 away from the bonding metal layer 105 to the reflective layer 104. The second electrode 108 is formed by using the electrode material filled in the second filling slot 1081. Configuration of the insulation material 110 between the second electrode 108 and a sidewall of the second filling slot 1081 achieves necessary insulation between the second electrode 108 and the bonding metal layer 105.

In the present embodiment, the first conductive layer 101 may have P type conductivity, and the second conductive layer 103 may have N type conductivity. Alternatively, the second conductive layer 103 may also have P type conductivity, and the first conductive layer 101 may also have N type conductivity.

Specifically, referring to FIG. 20 again, the semiconductor device provided by the present embodiment further includes multiple grooves 109 running from one side of the first conductive layer 101 away from said active layer 102 to said reflective layer 104. The grooves 109 divide the semiconductor device into multiple pixel units. The grooves 109 successively run through the first conductive layer 101, the active layer 102, the second conductive layer 103 and the reflective layer 104, and do not run through the insulation materials 110. The depths of the grooves 109 are each equal to a sum of thicknesses of the first conductive layer 101, the active layer 102, the second conductive layer 103 and the reflective layer 104.

In the embodiment of the present disclosure, each of the pixel units includes one first electrode 107 and one second electrode 109. The first electrode 107 in each pixel unit is connected with the bonding metal layer 105, so that said pixel units form a structure sharing the first conductive layer 101. Preferably, the second conductive layer 103 may be configured to have P type conductivity while the first conductive layer 101 have N type conductivity, thus forming a semiconductor device structure in which an N pole is shared. It should be indicated that for easy description, only three pixel units are shown in Figures, but the embodiment of present disclosure has no limits to specific number of the pixel units.

Specifically, the substrate 106 is preferably a silicon substrate, and of course may also be of other materials. The embodiment of present disclosure has no limits to the materials of the substrate 106. When the substrate 106 uses silicon, pixel units produced based on silicon wafers may obtain light rays of better uniformity. Moreover, relative to a sapphire substrate, the silicon wafer substrate is easier to be stripped off.

The reflective layer 104 may make partial light emitted from the active layer 102 emitted after reflection in a direction of the first conductive layer 101. Materials of the reflective layer 104 may be silver, aluminum, nickel or one of other metals capable of reflecting light, or a metal alloy or metal combination layer consist of a plurality of metals, or may also be an alloy super lattice structure.

The active layer 102 is located between the first conductive layer 101 and the second conductive layer 103. The active layer 120 may have a quantum well structure. The quantum well structure may include multiple quantum well layers and multiple quantum barrier layers formed between the quantum well layers. The quantum well layers and the quantum barriers preferably consist of $Al_xIn_yGa_{1-x-y}N$ ($0<x<1$, $0<y<1$, $0<x+y<1$), but have to satisfy that the quantum barrier has a wider energy band than the quantum well layer. For example, if it is gallium nitride based light emitting diode, the first conductive layer 101 may be formed by GaN doped with n type impurities, while the second conductive layer 103 may be formed by GaN doped with P type impurities, and the active layer 102 may be formed by alternately stacking the quantum well layers formed by $Al_xIn_yGa_{1-x-y}N$ ($0<x<1$, $0<y<1$, $0<x+y<1$) and the quantum barrier layers formed by AlInGaN and having a wider energy band.

Electrons, which are injected via the first conductive layer 101 and the second conductive layer 102, and electron holes are combined with each other in the active layer 102 to emit light, with the emitted light emitted through the first conductive layer 101.

It may be understood that the material of the bonding metal layer 105 may be one kind of metal of titanium, gold, nickel, tin, platinum and other metals, or a metal alloy or multi-metal layer consisting of a plurality of metals.

Multiple grooves 109 provided at one side of the first conductive layer 101 away from the active layer 102 divide the semiconductor device into multiple pixel units, and by different configurations of depths of the grooves 109, they may cooperate with the first electrodes 107 and the second electrodes 108 to form different pixel unit structure.

A structure sharing the first conductive layer 101 is formed between the pixel units via the device structure mentioned above, and the second conductive layer 103 may have P type conductivity, and the first conductive layer 101 may have N type conductivity. Configuration of a first electrode 107 and a second electrode in each pixel unit makes the difference of equivalent resistances between the pixel units reduced, solving the problem of uneven distribution of electric current flowing through different pixel units caused by the increase of distance between pixels and a contact electrode of an anode 115 and the increase of equivalent resistance of the conductive path.

Figure 21:
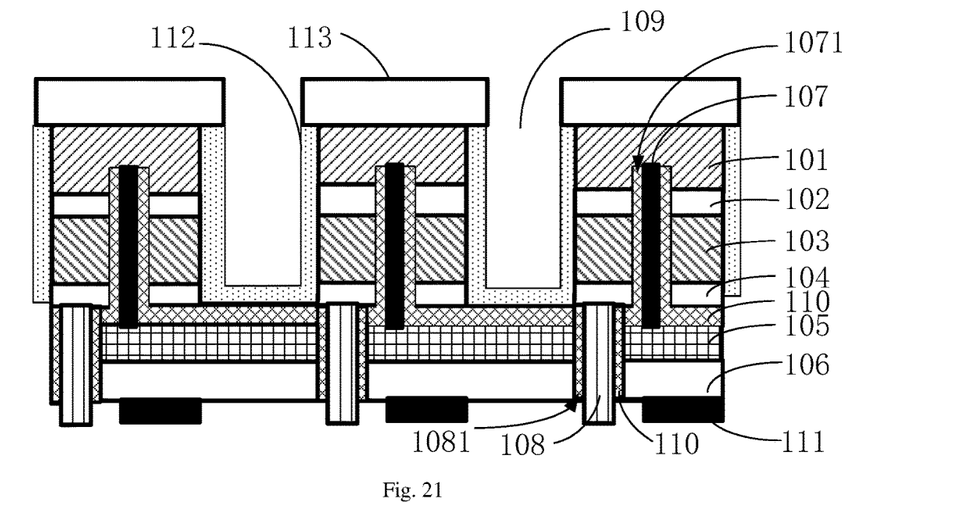
FIG. 21 is a section schematic view showing another semiconductor device provided by an embodiment of the present disclosure.

It may be understood that as show in FIG. 21, the insulation layer 112 may also be provided on bottoms and sidewalls of said grooves 109.

Further, in order to achieve color display of the semiconductor device, in embodiments of the present disclosure, the semiconductor device may further include a fluorescence powder layer 113 provided on the first conductive layer 101, wherein the fluorescence powder layer 113 may use fluorescence powder in a form of quantum dot.

Figure 22:
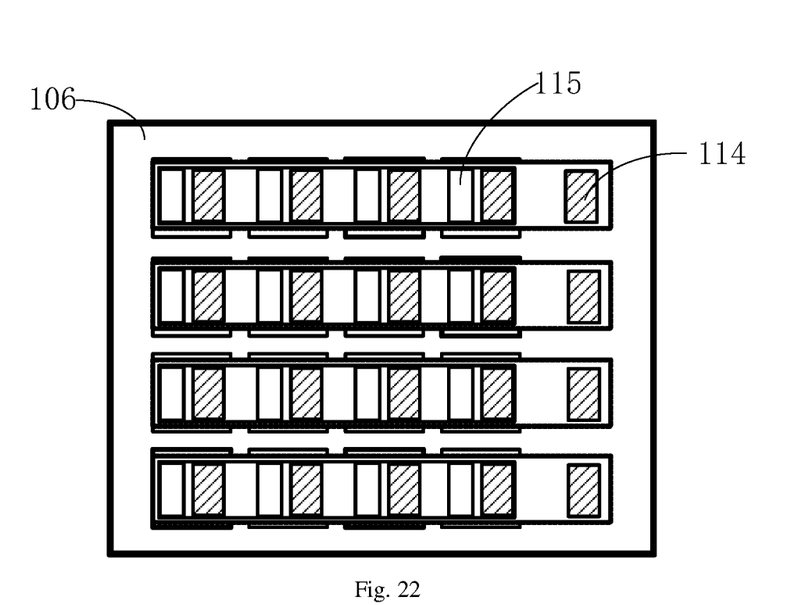
FIG. 22 is a schematic view showing a semiconductor device provided by an embodiment of the present disclosure, adopting a driving mode.
Figure 23:
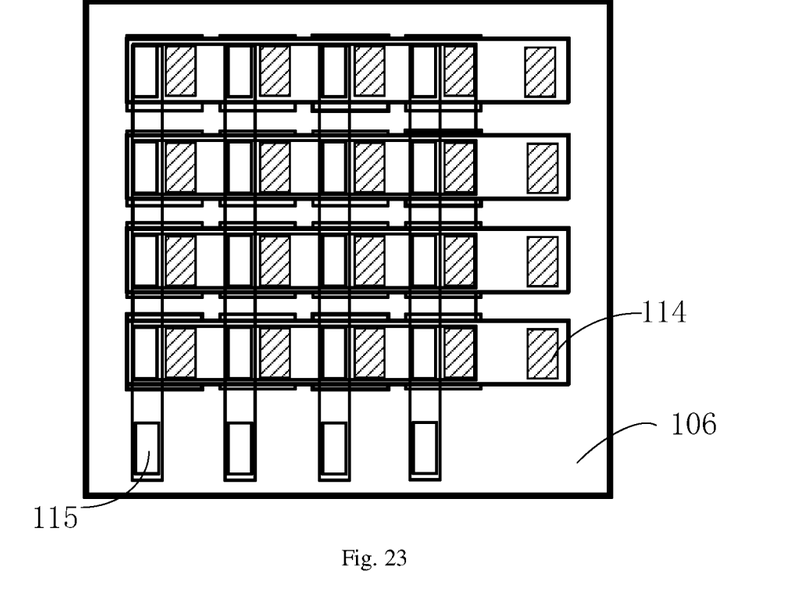
FIG. 23 is a schematic view showing a semiconductor device provided by an embodiment of present disclosure, adopting a driven mode.

The semiconductor device in the embodiments of the present disclosure needs driving by an external driving circuit to emit light. As shown in FIG. 22 and FIG. 23, specifically, it may be made in a driving or driven form.

It may be understood that as shown in FIG. 22, in the structure sharing the first conductive layer 101, when using a driving mode, said first electrodes 107 in each row of the pixel units are connected with an external driving circuit, and the first electrode 107 are electrically connected with each other. Since the first electrodes 107 are connected with the first conductive layer 101, the first conductive layer 101 may have n type conductivity, thus forming a cathode 114 connected with a negative electrode of an external driving circuit. The second electrodes 108 of individual pixel units, as the anodes 115, are independent from each other, and directly bonds to the driving circuit respectively.

When using a driven mode, as shown in FIG. 23, the individual independent second electrodes 108 in each column of the pixel units are electrically connected with each other and then connected with an external driving circuit, to form an anode 115 for connected with a positive electrode of the external driving circuit. The first electrodes 107 of each row of said pixel units are connected with the external driving circuit after electrically connected by the bonding metal layer 105.

In the driving mode, it has a relatively fast response speed and no limit to the quantity of the scanning electrode, each pixel unit may independently achieve addressing and independent control, and is suitable for most applications. While in the driven mode, it displays by a progressive scan mode, and has relatively low production cost and technical threshold, but is not able to well achieve a high resolution display.

As mentioned above, the semiconductor device in the embodiment of present disclosure has uniform light emitting and a higher light extraction rate, and by providing two independent electrodes in each pixel unit, reduces equivalent resistances between pixel units, eliminates interferences between pixel units, achieves better uniformity of emitted light wavelength, and also makes distribution of electric current flowing through different pixel units more even.

It should be also indicated that in description of the present disclosure, unless expressly specified or limited otherwise, the terms "provided," "mounted" "connected" and "coupled" should be understood broadly, and for example, it may be fixed connection, or may be detachable connection or integral connection; may be mechanical connection or electrical connection; may be direct connection or indirect connection via intermedia; or may be communication between two elements. Those skilled in the art can understand specific meaning of the above terms in the present disclosure according to specific situations.

It should be noticed that similar reference numbers and letters in the following figures indicate similar items, thus, once an item is defined in an accompanying figure, there is no need to further define and interpret it in subsequent figures.

In description of the present disclosure, it should be indicated that orientations or position relationships illustrated by terms such as "central," "upper," "lower," "left," "right," "vertical," "horizontal," "inner," "outer" are based on orientations or position relationships as shown in the accompanying figures, or usual orientations or position relationships of the inventive product when in use, only for facilitating describing the present disclosure and simplifying the description, rather than indicating or suggesting that related devices or elements have to be in the specific orientation or configured and operated in specific orientation, therefore they should not be construed as limiting the present disclosure. Besides, terms "first", "second", and "third" are used merely for descriptive purpose, but should not be understood as indicating or suggesting to have importance in relativity.

The foregoing descriptions are merely preferred embodiments of the present disclosure and are not intended to limit the present disclosure. For those skilled in the art, the present disclosure may have various modifications and variations. Any modifications, equivalent replacements, improvement and so on within the spirit and principle of the present disclosure should be covered in the protection scope of the present disclosure.

The invention claimed is:

1. A fabricating method for a semiconductor device, comprising steps of:

successively growing a first conductive layer, an active layer, a second conductive layer and a reflective layer on a base;

forming at least one first filling slot on one side, which is away from said second conductive layer, of said reflective layer, wherein said first filling slot is configured to completely run through said second conductive layer and said active layer and to partially run through said first conductive layer;

growing a layer of an insulation material on one side, which is away from said second conductive layer, of said reflective layer;

fabricating a first electrode in each first filling slot, in such a way that said first electrode is insulated from said reflective layer, said second conductive layer and said active layer, and that said first electrode is connected with said first conductive layer;

forming a bonding metal layer and a substrate at the side, which is away from said second conductive layer, of said reflective layer, wherein said first electrode is configured to successively penetrate through said reflective layer, said second conductive layer and said active layer from one side of said bonding metal layer away from said substrate, and to extend to said first conductive layer, so as to be connected with said bonding metal layer and said first conductive layer;

forming at least one second filling slot from one side, which is away from said reflective layer, of said substrate, with the at least one second filling slot successively running through said substrate and said bonding metal layer; and fabricating a second electrode in each second filling slot, in such a way that said second electrode is in contact with said reflective layer and insulated from said bonding metal layer and said substrate;

removing said base, and forming at least one groove configured to at least run through said first conductive layer, said active layer, said second conductive layer and said reflective layer, from one side of said first conductive layer away from said active layer, wherein said at least one groove is configured to divide said semiconductor device into different pixel units;

growing an insulation material at the side of said first conductive layer away from said active layer, and forming an insulation layer grown on said first conductive layer and a bottom and sidewalls of said at least one groove; and etching the insulation material grown on said first conductive layer, and forming a fluorescence powder layer on said first conductive layer.

2. The fabricating method as claimed in claim 1, wherein the step of fabricating a first electrode in each first filling slot comprises:

filling an insulation material in said first filling slot;

etching the insulation material in said first filling slot to form an accommodation space for accommodating an electrode material; and filling the electrode material in said accommodation space to form said first electrode, wherein said first electrode is insulated from said reflective layer, said second conductive layer and said active layer by the insulation material remaining in said first filling slot.

3. The fabricating method as claimed in claim 1, wherein the step of fabricating a second electrode in each second filling slot comprises:

filling an insulation material in said second filling slot;

etching the insulation material in said second filling slot to form an accommodation space for accommodating an electrode material; and filling the electrode material in said accommodation space to form said second electrode, wherein said second electrode is insulated from said bonding metal layer and said substrate by the insulation material remaining in said second filling slot.

* * * * *